United States Patent [19]

Kreinick et al.

[11] 4,124,824
[45] Nov. 7, 1978

[54] VOLTAGE SUBTRACTOR FOR SERIAL-PARALLEL ANALOG-TO-DIGITAL CONVERTER

[75] Inventors: Stephen J. Kreinick, San Diego, Calif.; Fuad H. Musa; Pern Shaw, both of Austin, Tex.

[73] Assignee: Motorola, Inc., Schaumburg, Ill.

[21] Appl. No.: 764,491

[22] Filed: Jan. 31, 1977

[51] Int. Cl.² .............................................. H03F 3/45
[52] U.S. Cl. ................................. 330/252; 307/350; 328/158; 330/257
[58] Field of Search ................ 307/350, 355; 328/158; 330/252, 257

[56] References Cited

U.S. PATENT DOCUMENTS

| | | | |
|---|---|---|---|
| 3,783,307 | 1/1974 | Breuer | 330/252 X |
| 4,032,801 | 6/1977 | Fulkerson | 307/355 X |

*Primary Examiner*—Lawrence J. Dahl
*Attorney, Agent, or Firm*—Anthony J. Sarli, Jr.

[57] ABSTRACT

A high-speed voltage subtractor circuit suitable for use in a serial-parallel A/D converter uses differential current switches to select a predetermined reference voltage value as one input to a precision current matching circuit whose other input is an applied analog input signal. An output buffer circuit coupled to the current matching circuit produces an output signal equal to the difference between the analog input signal and the reference voltage value.

9 Claims, 2 Drawing Figures

FIG. 1

VOLTAGE SUBTRACTOR FOR SERIAL-PARALLEL ANALOG-TO-DIGITAL CONVERTER

RELATED APPLICATIONS

This application is related to Assignees' co-pending Patent Application "SERIAL-PARALLEL ANALOG-TO-DIGITAL CONVERTER WITH OVERLAPPING OPERATIONS," Ser. No. 764,499, filed on even date herewith.

BACKGROUND

The present invention relates to analog-to-digital conversion and, in particular, to a voltage subtractor circuit suitable for use in a serial-parallel analog-to-digital converter with overlapping operations.

In Assignees' above-mentioned co-pending patent application a serial-parallel A/D converter circuit is described which includes a particular type of high-speed voltage subtractor. The particular type of high-speed voltage subtractor disclosed made use of a precision high-speed operational amplifier and an associated circuit network which included logarithmic impedance means to provide feedback paths for that operational amplifier. Although that circuit configuration offered advantages in terms of simplicity of over-all circuit structure, the design requirements of a precision high-speed operational amplifier are often difficult to attain, particularly in a monolithic integrated circuit embodiment.

SUMMARY OF THE INVENTION

Accordingly, it is an object of this invention to provide an improved high-speed voltage subtractor circuit which does not require the use of a precision high-speed operational amplifier.

Briefly described, the present invention is an improved high-speed voltage subtractor circuit which uses differential current switches to select a predetermined reference voltage value as one input to a precision current matching circuit whose other input is an applied analog input signal. An output buffer circuit coupled to the current matching circuit produces an output signal equal to the difference between the analog input signal and the reference voltage value.

DETAILED DESCRIPTION

Figure 1:
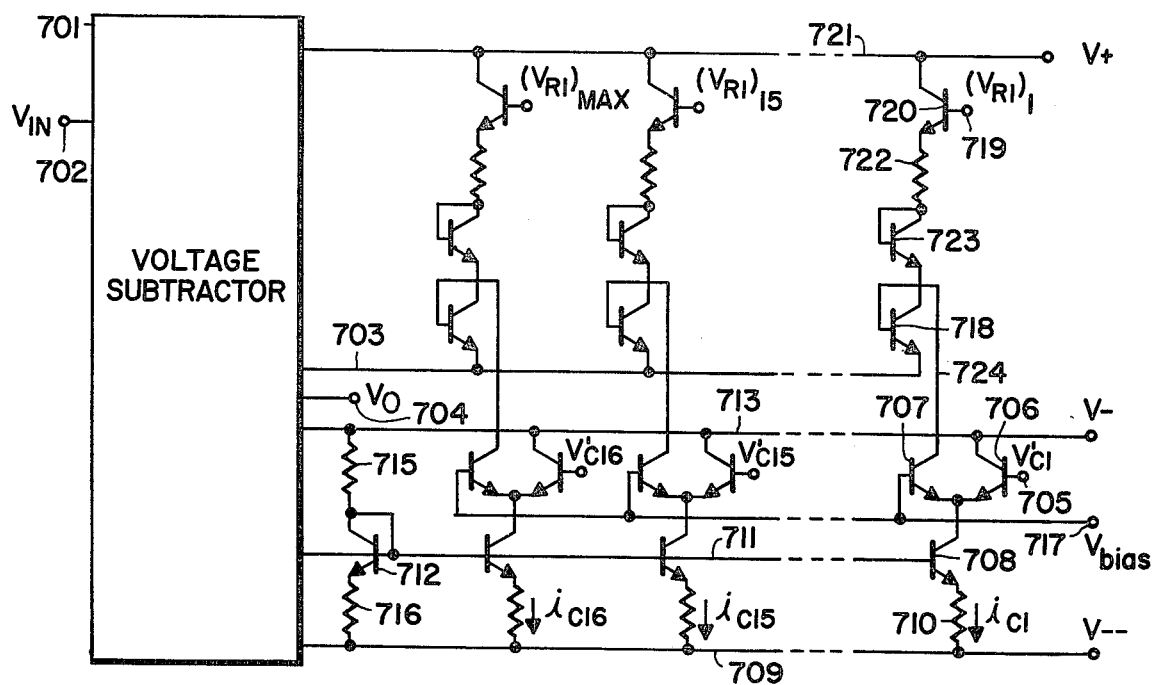
FIG. 1 shows a circuit schematic of reference voltage circuitry employed in use of the voltage subtractor of the present invention.
Figure 2:
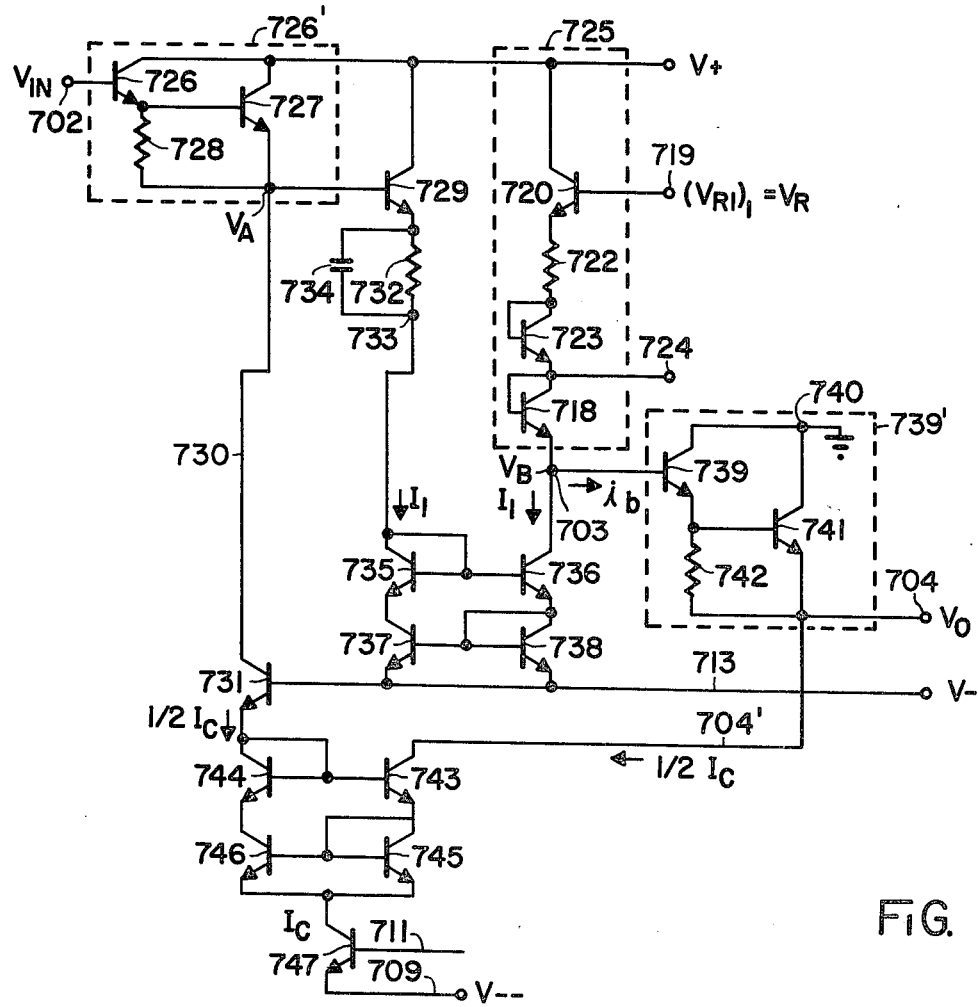
FIG. 2 shows a simplified circuit schematic useful in explaining the operation of the voltage subtractor of the present invention.

FIG. 1 shows the voltage subtractor of the present invention together with associated circuitry which is helpful in explaining its operation. The basic circuit elements of the subtractor, which are shown in detail in FIG. 2, are contained within the block designated 701. As indicated in Assignees' above-mentioned co-pending patent application, the basic function of the voltage subtractor is to subtract a predetermined reference voltage from the applied analog input signal to obtain an analog difference signal. In FIG. 1, the applied analog input signal $V_{IN}$ is coupled to voltage subtractor 701 via conductor 702, and conductor 703 provides a current path by which a translated, or level shifted, version of a predetermined reference voltage value is applied to the subtractor. Conductor 704 provides the analog difference signal output of the subtractor which is designated $V_O$. As described in the aforementioned co-pending patent application, the particular reference voltage value to be applied to the subtractor is determined by a high level on a particular comparator output, which is activated as a result of a first parallel conversion operation. In FIG. 1, these comparator outputs which have been level shifted using circuitry not shown in the figure are applied to differential current switches, whose action determines which reference voltage value will be applied to the voltage subtractor.

Thus, a first comparator output VC1 is applied via conductor 705 to the base of transistor 706. The emitter of transistor 706 couples to the emitter of transistor 707 to form a differential current switch and these common emitters are coupled to the collector of constant current source transistor 708, whose emitter couples to a V— power supply conductor 709 via resistor 710. The base of constant current source transistor 708 couples to constant current source reference conductor 711. Constant current source reference conductor 711 couples to the base of transistor 712, which generates this reference. The base and collector of transistor 712 are coupled to V— power supply conductor 713 via resistor 715 and the emitter of transistor 712 couples to V— power supply conductor 709 via resistor 716, thereby providing the operating bias required to generate the current reference. As shown in FIG. 1, current source reference conductor 711 also couples to voltage subtractor 701 thereby providing the reference required by current sources within that circuit as is described below.

Turning again to the differential current switch formed by transistor 706 and 707, the base of transistor 707 couples to a bias voltage conductor 717, which also couples to other differential current switches in the circuit. The collector of transistor 706 couples to V— power supply conductor 713 and the collector of transistor 707 couples to the collector of transistor 718, which is part of the voltage reference coupling network associated with a first reference voltage value $(V_{R1})_1$ which is applied via conductor 719 to the base of transistor 720. The collector of transistor 720 couples to a V+ power supply conductor 721 and the emitter of transistor 720 couples via resistor 722 to the base and collector of transistor 723. The emitter of transistor 723 couples to the collector and base of transistor 718 thereby completing the coupling to the collector of differential current switch transistor 707. The emitter of transistor 718 couples to conductor 703 which, as previously mentioned, provides the common path by which voltage reference values are coupled to the voltage subtractor. It should be noted that for simplicity, FIG. 1 only shows a skeletonized version of the actual current switching and reference voltage coupling circuitry required for the operation of voltage subtractor 701. In the actual circuit, a total of sixteen level shifted comparator signals, as represented by the $V_{C1}$ signal on conductor 705, are used to control the application of sixteen voltage reference values such as represented by $(V_{R1})_1$ on conductor 719. For simplicity, FIG. 1 shows only the first, the fifteenth and the sixteenth of these duplicate circuit structures.

In terms of circuit operation, the application of a reference voltage value to voltage subtractor 701 depends on the conductive state of the differential current switch transistors represented by transistor 706 and 707. As described in Assignees' above-mentioned co-pending patent application, only one of the comparator signals represented by the signal on conductor 705 can be high as a result of first conversion when the signal on conductor 705 is in the low state. Transistor 706 is then non-conducting and transistor 707 is conducting and the current conducted by transistor 707 acts to decouple the associated reference voltage value on conductor 719 from voltage subtractor 701. Conversely, when the comparator signal on conductor 705 is high (the active state) transistor 707 will be non-conducting and this non-conduction acts to allow the voltage reference value on conductor 719 to be coupled to voltage subtractor 701. The particular manner in which this coupling and decoupling is accomplished is explained in the detailed description of the circuit operation of voltage subtractor 701 given below.

FIG. 2 shows the detailed circuit structure of voltage subtractor circuit 701 and a portion of associated circuitry previously shown in FIG. 1 arranged to facilitate an explanation of circuit operation. As the subsequent circuit equations will demonstrate, the voltage subtractor of the present invention functions by using transistor networks to couple an applied analog input signal and a predetermined reference voltage value to precision current splitting networks from which are derived the required analog difference signal output. In FIG. 2, the circuitry associated with the first reference voltage value $(V_{R1})_1$ will be used to illustrate the operation of the subtractor, dotted box 725 denotes this portion of the circuitry, and conductor designations from FIG. 1 are also used to further clarify the over-all circuit structure. Thus, it is to be re-emphasized that the total circuit structure consists of sixteen identical transistor networks identical to the particular network 725 shown in FIG. 2, each of which has a separate reference voltage value analogous to $(V_{R1})_1$ and each of which is coupled to a separate differential current switch (not shown) via a conductor analogous to conductor 724. All of these 16 identical circuits couple to a common conductor 703, as shown in FIG. 1 and FIG. 2. For convenience in explaining operation, the voltage present on conductor 703 will be designated $V_B$.

Turning now to the structure and operation of the remaining circuitry in FIG. 2, the applied analog input signal $V_{IN}$ couples to the base of transistor 726 via conductor 702. The collector of transistor 726 couples to the V+ power supply conductor 721. The emitter of transistor 726 couples to the base of transistor 727. A resistor 728 couples from the base of transistor 727 to the emitter of transistor 727. The value of resistor 728 will be designated $r$, and the voltage at the emitter of transistor 727 will be designated $V_A$. The collector of transistor 727 couples to V+ power supply conductor 721 and the emitter of transistor 727 couples to the base of transistor 729. The emitter of transistor 727 also couples to conductor 730 which couples to the collector of transistor 731. The collector of transistor 729 couples to V+ power supply conductor 721 and the emitter of transistor 729 couples to a first terminal of resistor 732 whose second terminal couples to conductor 733. A capacitor 734 couples between the first and second terminals of resistor 732. The value of resistor 732 is designated as R and, similarly, the value of resistor 722 (previously described for FIG. 1) is also designated R. Conductor 733 couples to the collector and the base of transistor 735 whose base couples to transistor 736. The collector of transistor 736 couples to conductor 703 which, as previously described, couples in common to the other reference voltage circuits analogous to circuit 725. The emitter of transistor 735 couples to the collector of transistor 737 whose emitter couples to the V− power supply conductor 713. The emitter of transistor 736 couples to the collector and the base of transistor 738 and to the base of transistor 737. The emitter of transistor 738 couples to the V− power supply conductor 713 which also couples to the base of transistor 731. Conductor 703 couples to the base of transistor 739 whose collector couples to ground power supply conductor 740. The emitter of transistor 739 couples to the base of transistor 741 whose collector couples to ground power supply conductor 740 and whose emitter couples to conductor 704 which is the analog difference output conductor $V_O$ of the subtractor circuit. Resistor 742, whose value is designated $r$, couples between the base and the emitter of transistor 741. Conductor 704 couples to the collector of transistor 743 and the current flowing in the collector of transistor 743 is designated $\frac{1}{2}(I_C)$. The emitter of transistor 731 couples to the collector and the base of transistor 744 and the base of transistor 744 also couples to base of transistor 743. The current flowing from the emitter of transistor 731 into this common coupling is designated $\frac{1}{2}(I_C)$. The emitter of transistor 743 couples to the collector and base of transistor 745 and the base of transistor 745 couples to the base of transistor 746 whose collector couples to the emitter of transistor 744. The emitter of transistor 745 and the emitter of transistor 746 couple in common to the collector of constant current source transistor 747 whose emitter couples to the V− power supply conductor 709 and whose base couples to the constant current reference conductor 711, previously described in FIG. 1. The constant current value flowing in the collector of constant current source transistor 747 is designated $I_C$.

The basic subtractor circuit of the present invention, as shown in FIG. 2, is operated by generating the voltage difference of $(V_R − V_{IN})$ with respect to the V− power supply voltage through voltage level shifting techniques. The analog input voltage $V_{IN}$ is connected to the input buffer circuit formed by transistors 726 and 727 and resistor 728 to generate the voltage $V_A$. The voltage between $V_A$ (conductor 730) and V− (conductor 713) sets the current value $I_1$ in accordance with the equation $$I_1 = (V_A - (V-) - 3 V_{BE})/R$$

where $V_{BE}$ is the base-emitter junction voltage of each of transistors 729, 736 and 738 at the emitter current level $I_1$ and R is the resistance value of resistor 732. The precision current mirror network formed by transistors 737, 736 and 738 mirrors the current $I_1$ through the reference branch formed by transistor 720, resistor 722, transistor 723 and transistor 718. Finally, the modified Darlington network formed by transistors 739 and 741 and resistor 742 form an output buffer which produces output voltage $V_O$. As shown in the circuit, the input buffer formed by transistors 726 and 727 and resistor 728 couples via conductor 730 and transistor 731 to one side of a second precision current mirroring circuit formed by transistors 744, 743, 745 and 746. In a similar manner, the output buffer formed by transistors 739 and 741 and resistor 742 couples to the other side of this precision current mirror (collector of transistor 743) via conductor 704' and because of the current mirror, both the input buffer 726' and the output buffer 739' conduct equal currents. Assuming all devices are reasonably matched (a design requirement readily achieved in a monolithic integrated circuit embodiment), the transistors will have equal base-to-emitter junction voltages and the following equations will, therefore, be satisfied.

$$V_{IN} - V_A = V_B - V_O$$
$$V_A - (V-) = I_1 R + 3V_{BE} = V_R - V_B$$
$$V_R + (V-) = V_A + V_B = V_{IN} + V_O$$
$$V_O - (V-) = V_R - V_{IN}$$
$$V_O = (V_R - V_{IN}) + (V-)$$

Thus, the circuit shown obtains the desired result of generating an output voltage which is equal to the difference between a predetermined reference value and an applied analog input signal offset by a constant (the power supply voltage V−). To further increase the accuracy of the circuit, a dummy load can be connected to conductor 733 to compensate for the base current of transistor 739 (designated $i_b$). Capacitor 734 is a feed-forward capacitor added across resistor 732 to speed subtraction. The value of capacitor 734 can be chosen to obtain critical damping and thereby achieve optimum settling time of the output voltage $V_O$ of the subtractor.

The subtractor circuit of the present invention performs the required subtraction between one of the reference voltages and the input in a fast and stable fashion and no high-speed operational amplifier is needed. To guarantee proper operation of the current mirror, the reference voltage $V_R$ must be greater than $V_{IN}$ to insure that all devices operate in the linear region.

What is claimed is:

1. A subtractor circuit comprising:
   an output;
   a first input for receiving an analog input voltage;
   a second input for receiving a first reference voltage;
   a conductor for receiving a second reference voltage;
   a first means coupled to said input and to said conductor and responsive to said analog input voltage for producing a first current which is a function of the difference between said analog input voltage and said second reference voltage;
   first current source means responsive to said first current for producing a second current which is proportional to said first current;
   second means coupled to said second input and responsive to said second current and to said first reference voltage for producing an output voltage at said output representative of the difference between said analog input voltage and said first reference voltage.

2. The subtractor circuit as recited in claim 1 wherein said first means includes first impedance means coupled to said first input and to said conductor for producing said first current.

3. The subtractor circuit as recited in claim 1 wherein said second means includes a second impedance coupled to said first current source means and to said second input for producing a voltage which is proportional to the difference between said analog input voltage and said first reference voltage.

4. The subtractor circuit as recited in claim 2 wherein said first means further includes input means for coupling said first input to said first impedance means.

5. The subtractor circuit as recited in claim 3 wherein said second means further includes output means coupling said second impedance means to said output for producing said output voltage shifted in level from said voltage.

6. The subtractor circuit as recited in claim 4 wherein said first impedance means is a first resistor, and said input means includes a first transistor, a second transistor, and a third transistor, each having their respective collectors connected to a first voltage conductor, said first transistor having its base connected to said first input and its emitter connected to the base of said second transistor, the emitter of said second transistor being connected to the base of said third transistor, the emitter of said third transistor being connected to said first resistor.

7. The subtractor circuit as recited in claim 6 wherein said first current source means includes fourth, fifth, sixth, and seventh transistors, the collector and base of said fourth transistor being connected to said first resistor, the emitter of said fourth transistor being connected to the collector of said fifth transistor, the emitter of said fifth transistor being connected to said conductor, the collector and base of said sixth transistor being connected to the base of said fifth transistor and to the emitter of said seventh transistor, the emitter of said sixth transistor being connected to said conductor, the base of said seventh transistor being connected to the base of said fourth transistor, and the collector of said seventh transistor being connected to said second means.

8. The subtractor circuit as recited in claim 6 wherein said second impedance means is a second resistor substantially equal in value to said first resistor, and wherein said second means further includes a fourth transistor having its base connected to said second input and its emitter connected to said second resistor, and wherein said output means includes fifth, sixth, seventh, and eighth transistors, said fifth transistor having its collector and base connected to said second resistor, and its emitter connected to the collector and base of said sixth transistor, said sixth transistor having its emitter connected to said first current source means and to the base of said seventh transistor, said seventh transistor having its emitter connected to the base of said eighth transistor, said eighth transistor having it emitter connected to said output.

9. The subtractor circuit as recited in claim 1 wherein said second current is substantially equal to said first current.

* * * * *